United States Patent
Park (10) Patent No.: US 10,317,471 B2
(45) Date of Patent: Jun. 11, 2019

(54) BATTERY COMMUNICATION DIAGNOSIS METHOD

(71) Applicant: LG CHEM, LTD., Seoul (KR)

(72) Inventor: Mi So Park, Daejeon (KR)

(73) Assignee: LG Chem, Ltd. (KR)

( * ) Notice: Subject to any disclaimer, the term of this patent is extended or adjusted under 35 U.S.C. 154(b) by 3 days.

(21) Appl. No.: 15/702,067

(22) Filed: Sep. 12, 2017

(65) Prior Publication Data

US 2018/0074135 A1  Mar. 15, 2018

(30) Foreign Application Priority Data

Sep. 13, 2016  (KR) .................. 10-2016-0117880

(51) Int. Cl.
| | |
|---|---|
| G06F 11/00 | (2006.01) |
| G01R 31/36 | (2019.01) |
| G01R 31/382 | (2019.01) |
| G01R 31/367 | (2019.01) |
| G06F 1/26 | (2006.01) |
| G01R 31/371 | (2019.01) |

(52) U.S. Cl.
CPC ....... *G01R 31/3647* (2019.01); *G01R 31/367* (2019.01); *G01R 31/382* (2019.01); *G01R 31/371* (2019.01); *G06F 1/26* (2013.01)

(58) Field of Classification Search
CPC ... G06F 1/26; G06F 11/2205; G01R 31/3606; G01R 31/3693
See application file for complete search history.

(56) References Cited

U.S. PATENT DOCUMENTS

| | | | | |
|---|---|---|---|---|
| 2012/0013201 A1* | 1/2012 | Pariseau | ............... | H01M 10/48 307/125 |
| 2014/0117939 A1* | 5/2014 | Lim | ................... | H01M 10/482 320/134 |
| 2014/0199569 A1* | 7/2014 | Sisk | ....................... | B60L 3/0046 429/91 |
| 2014/0347013 A1* | 11/2014 | Kim | ................... | G01R 31/3606 320/134 |
| 2016/0190830 A1* | 6/2016 | Kuhlmann | ............ | H02J 7/0026 320/116 |
| 2016/0245874 A1* | 8/2016 | Kang | .................. | B60L 11/1851 |
| 2017/0285113 A1* | 10/2017 | Hsiao | ................ | G01R 31/3689 |
| 2017/0328956 A1* | 11/2017 | Zhang | ....................... | H02J 7/00 |
| 2018/0029474 A1* | 2/2018 | Berels | ...................... | B60L 3/12 |

FOREIGN PATENT DOCUMENTS

| | | | | | |
|---|---|---|---|---|---|
| JP | 2014527680 A | * | 10/2014 | ............ | H01M 10/48 |
| JP | 2016532400 A | * | 10/2016 | ............ | H04L 12/28 |
| KR | 20100020253 A | * | 2/2010 | ............ | H04L 12/28 |
| KR | 10-2014-0004954 A | | 1/2014 | | |
| KR | 20160041260 A | * | 4/2016 | ............ | H04L 12/28 |

* cited by examiner

*Primary Examiner* — Joshua P Lottich
(74) *Attorney, Agent, or Firm* — Lerner, David, Littenberg, Krumholz & Mentlik, LLP (57) ABSTRACT

The present disclosure relates to a battery communication diagnosis method, and more particularly, to a battery communication diagnosis method for diagnosing a state of communication periodically performed between battery management systems (BMSs) in a battery to prevent a message or data from being omitted during communication.

17 Claims, 4 Drawing Sheets

BATTERY COMMUNICATION DIAGNOSIS METHOD

CROSS-REFERENCE TO RELATED APPLICATION

This application claims priority to Korean Patent Application No. 10-2016-0117880 filed on Sep. 13, 2016 and all the benefits accruing therefrom under 35 U.S.C. § 119, the contents of which are incorporated by reference in their entirety.

BACKGROUND

The present disclosure relates to a battery communication diagnosis method, and more particularly, to a battery communication diagnosis method for diagnosing a state of communication periodically performed between battery management systems (BMSs) in a battery to prevent a message or data from being omitted during communication.

In recent years, as control systems become increasingly complicated and intelligent at the same time and the performance of semiconductor devices such as microprocessors is improved and their prices are lowered, the demand for distributed control systems is increasing, and the need for a real-time network for control is emphasized. A Controller Area Network (CAN) (hereinafter referred to as "CAN communication") is mainly used as a communication network for supporting the communication of the real-time network for control. The CAN communication was originally developed as an automotive network protocol in the 1980s. It has excellent performance and low cost, and is designated by ISO as the serial communication protocol ISO11898 international standard, and is actively applied to other industrial fields. Specifically, the CAN communication is a single network bus on which all on-board peripherals can be attached, and has the features of detecting and correcting high noise immunity and errors with respect to high-speed data processing, and is widely used in various industrial fields such as manufacturing, aviation, and railroad.

Such CAN communication is also used for a battery. The battery is formed with a structure in which a plurality of battery modules are connected in series or in parallel, and each battery module has a module BMS for controlling the battery module.

Figure 1:
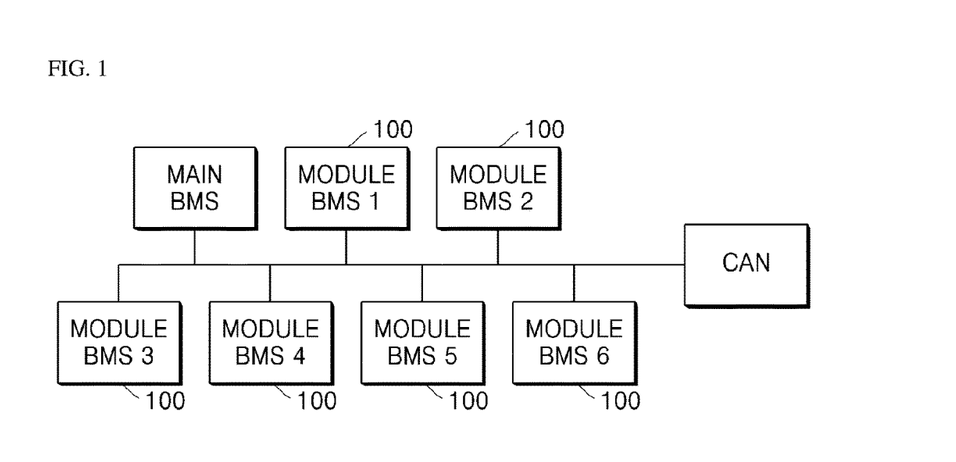
FIG. 1 is a configuration diagram schematically showing a communication structure of BMSs in a battery.

FIG. 1 is a configuration diagram schematically showing a communication structure of BMSs in a battery.

Referring to FIG. 1, a main BMS for controlling the overall battery operation performance and module BMSs (hereinafter referred to as BMSs) for each battery module are connected in series to one network bus.

When the BMS configured in such a connection mode performs continuous or periodic communication with one or more BMSs, if the number of communicating messages is large, it is difficult to grasp whether all messages are received in the BMS normally.

Therefore, it is required to develop a technology that can detect a missing message during communication between BMSs and determine the state of the corresponding communication to monitor the abnormality state of the communication in real time.

PRIOR ART DOCUMENTS

Patent Documents (Patent Document 1) KR2014-0004954 A

SUMMARY

The present disclosure provides a battery communication diagnosis method for confirming whether or not all messages communicated between BMSs of a battery module are received and a communication state.

In accordance with an exemplary embodiment, battery communication diagnosis method between a plurality of battery management systems (BMSs) The method includes: a communication diagnosis preparation operation for setting a communication diagnosis period for each BMS and allocating a diagnosis variable, a message buffer, and a temporary storage; a normal diagnosis performance operation for counting an abnormality state occurrence if a communication state is abnormal by diagnosing the communication state for each BMS with respect to the plurality of BMSs; and an abnormality state notification operation for finally determining a state of a corresponding communication is an abnormality state to inform a main BMS if a value counted in the normal diagnosis performance operation exceeds a predetermined value, wherein if the value counted by the normal diagnosis performance operation does not exceed the predetermined value, the normal diagnosis performance operation is repeated according to the set communication diagnosis period.

The diagnosis variable may be allocated to have a bit size equal to or greater than the number of messages received at each BMS to record whether or not each of the messages is normally received and may include an old diagnosis variable for recording whether or not messages of a previous diagnosis period are normally received and a new diagnosis variable for recording whether or not messages of a current diagnosis period are normally received, and each bit of the old diagnosis variable and the new diagnosis variable may be allocated as a diagnosis flag indicating whether or not each of the messages of the previous diagnosis period and the current diagnosis period received at the BMS is normally received.

The normal diagnosis performance operation may include: a diagnosis variable recording operation including an old diagnosis variable recording operation for recording whether or not messages in a previous diagnosis period are normally received in an old diagnosis variable in each diagnosis variable allocated in the communication diagnosis preparation operation and a new diagnosis variable recording operation for recording whether messages in a current diagnosis period are normally received in a new diagnosis variable; a diagnosis variable comparison operation for comparing each diagnosis flag including the old diagnosis variable and the new diagnosis variable recorded in the diagnosis variable recording operation; and a communication abnormality determination operation for determining that a state of a corresponding communication is an abnormality state and counting the state if it is determined in the diagnosis variable comparison operation that a continuous abnormality reception value is recorded in a diagnosis flag of the same position.

The normal diagnosis performance operation may includes: a diagnosis variable recording operation including a new diagnosis variable recording operation for recording whether or not messages in a current diagnosis period are normally received in each diagnosis variable allocated in the communication diagnosis preparation operation and an old diagnosis variable replacement operation for replacing the diagnosis variable of the previous diagnosis period recorded in the previous diagnosis period with the old diagnosis variable; a diagnosis variable comparison operation for comparing each diagnosis flag including the new diagnosis variable and the old diagnosis variable recorded in the diagnosis variable recording operation; and a communication abnormality determination operation for determining that a state of a corresponding communication is an abnormality state and counting the state if it is determined in the diagnosis variable comparison operation that a continuous abnormality reception value is recorded in a diagnosis flag of the same position.

In the case of a first diagnosis period in the diagnosis variable recording operation, all the old diagnosis variables may be recorded as a normal reception state.

The communication state diagnosis period of the communication diagnosis preparation operation may be set according to a message transmission period of each BMS transmitting a message.

A message buffer of the communication diagnosis preparation operation may store messages of a corresponding communication received at a BMS of a current diagnosis period.

A temporary storage of the communication diagnosis preparation operation may store messages of a corresponding communication received at a BMS of a previous diagnosis period.

The diagnosis variable comparison operation may compare each diagnosis flag of a new diagnosis variable and an old diagnosis variable recorded in the diagnosis variable recording operation by using a bit operator.

In accordance with another exemplary embodiment, a communication diagnosis device is included in a BMS of each battery module and diagnoses communication between BMSs of at least one battery module. The device includes: a communication diagnosis preparation unit configured to set a communication diagnosis performance option to perform a communication diagnosis between BMSs of the battery module; a communication diagnosis performance unit configured to repeat diagnosing whether or not communication is abnormal according to the communication diagnosis performance option set in the communication diagnosis preparation unit; and a notification unit configured to transmit a communication abnormality notification signal of a corresponding communication to a main BMS if the communication diagnosis performance unit diagnoses that the corresponding communication is abnormal.

The communication diagnosis preparation unit may include: a diagnosis period setting unit configured to set a diagnosis period in which a communication diagnosis is performed based on a message transmission period of each BMS transmitting a message to a BMS of one battery module; a diagnosis variable allocation unit configured to allocate a diagnosis variable to record whether or not messages received at an BMS of the battery module are normally received; a message buffer allocation unit configured to allocate a message buffer to store messages of a corresponding communication received at a BMS of the battery module of a current diagnosis period; and a temporary storage allocation unit configured to allocate a temporary storage to store messages of a corresponding communication received at a BMS of the battery module of a previous diagnosis period.

The diagnosis variable allocation unit may allocate an old diagnosis variable for recording whether or not messages of a previous diagnosis period are normally received and a new diagnosis variable for recording whether or not messages of a current diagnosis period are normally received, with a bit size equal to or greater than the number of messages received at each BMS to allocate a diagnosis flag indicating whether or not each of the messages of the previous diagnosis period and the current diagnosis period received at the BMS is normally received to each bit of the old diagnosis variable and the new diagnosis variable.

The communication diagnosis performance unit may include: a recording unit including an old diagnosis variable recording unit for recording whether or not messages in a previous diagnosis period are normally received in an old diagnosis variable allocated from the diagnosis variable allocation unit and a new diagnosis variable recording unit for recording whether or not messages in a current diagnosis period are normally received in a new diagnosis variable; a diagnosis variable comparison unit configured to compare each diagnosis flag including the old diagnosis variable and the new diagnosis variable recorded by the recording unit; and a communication abnormality determination unit configured to determine that a corresponding communication is abnormal based on a comparison result of the diagnosis variable comparison unit.

The communication diagnosis performance unit may include: a recording unit including an old diagnosis variable replacement unit for replacing a new diagnosis variable of a previous diagnosis period recorded in the previous diagnosis period with an old diagnosis variable allocated from the diagnosis variable allocation unit, and a new diagnosis variable recording unit for recording whether or not messages in a current diagnosis period are normally received in a new diagnosis variable; a diagnosis variable comparison unit configured to compare each diagnosis flag including the old diagnosis variable and the new diagnosis variable recorded in the recording unit; and a communication abnormality determination unit configured to determine that a corresponding communication is abnormal based on a comparison result of the diagnosis variable comparison unit.

In the case of a first diagnosis period in the diagnosis variable recording unit, all old diagnosis variables may be recorded as a normal reception state.

The diagnosis variable comparison unit may compare values through a comparison operator.

The communication abnormality determination unit may include: an abnormality state determination unit configured to determine an abnormality state of communication according to a comparison result of the diagnosis variable comparison unit; a counter configured to count the number of abnormality state determinations if the abnormality state determination unit determines that a state of a corresponding communication is an abnormality state; a count value comparison unit configured to compare whether or not a value counted by the counter exceeds a predetermined value; and a communication abnormality final determination unit configured to finally determine that the state of the corresponding communication is the abnormality state if the value counted by the count value comparison exceeds the predetermined value.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, exemplary embodiments of the present disclosure will be described in more detail with reference to the contents described in the accompanying drawings. However, the present disclosure is not limited or restricted to exemplary embodiments. Only, the technical spirit of the present disclosure is disclosed to the full through the description of the embodiments, and it is provided to those skilled in the art that the present disclosure belongs to inform the scope of the present disclosure completely.

Although the terms "first," "second," etc., may be used herein to describe various elements, these elements should not be limited by these terms. The above terms are used only to distinguish one component from another. For example, a first component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Terms used in this specification may be currently widely used general terms in consideration of functions in the present disclosure but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present disclosure should be defined based on the meaning of the term and the entire contents of the present disclosure instead of the simple term name.

1. Battery Communication Diagnosis Method According to Embodiment of Present Invention The battery communication diagnosis method of the present disclosure is a method of recording whether or not all messages are received at each diagnostic period and comparing records for each period to compare abnormality states of corresponding communication.

Figure 2:
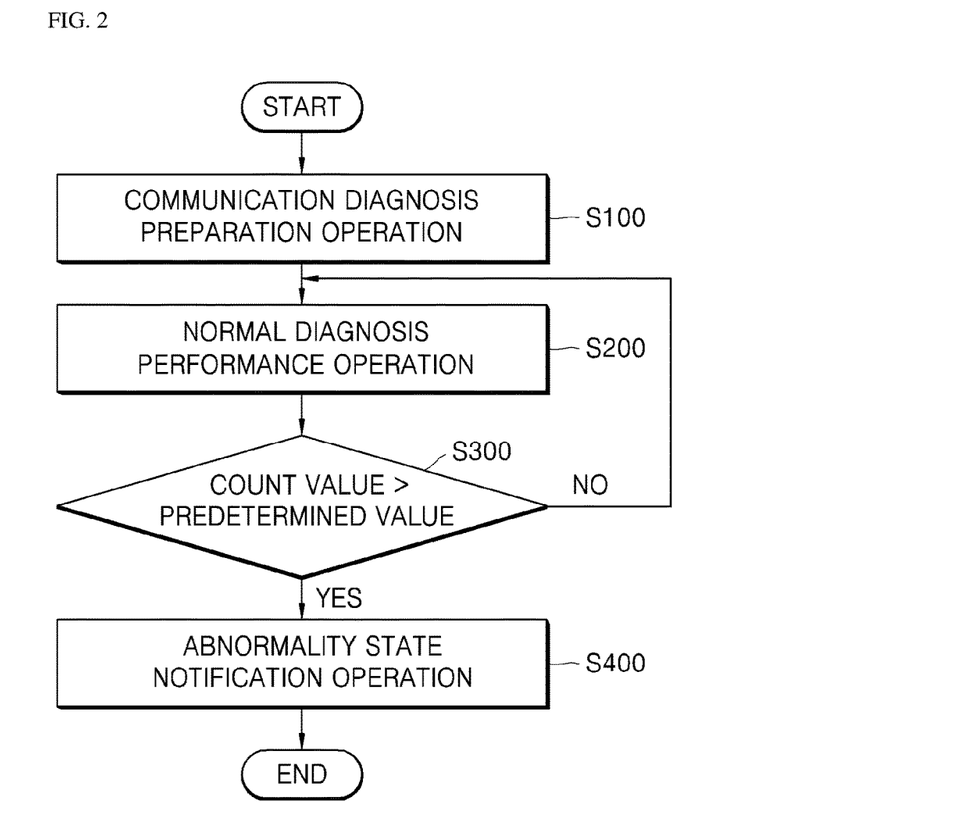
FIG. 2 is a flowchart showing a battery communication diagnosis method according to an exemplary embodiment.

FIG. 2 is a flowchart showing a battery communication diagnosis method according to an exemplary embodiment.

Referring to FIG. 2, the battery communication diagnosis method according to an exemplary embodiment is a method for setting a communication state diagnosis period for each individual BMS and allocating a diagnosis variable, a message buffer, and a temporary storage to prepare for diagnosing a communication state of each BMS (communication diagnosis preparation operation: S100).

Herein, the communication state diagnosis period is set according to each message transmission period of each BMS that transmits a message to one BMS. The diagnosis variable includes an old diagnosis variable for recording whether the messages of the previous diagnosis period are normally received and a new diagnosis variable for recording whether or not the messages are normally received.

Also, the temporary storage may store the messages of the corresponding communication received in the BMS of the previous diagnosis period, and the message buffer may store the messages of the corresponding communication received in the BMS of the current diagnosis period. By checking the temporary storage and the message buffer, it is possible to confirm whether or not the messages received periodically between the BMSs are normally received.

On the other hand, as a communication state for each BMS is diagnosed with respect to the plurality of BMSs, if it is abnormal, the occurrence of the abnormality state of the corresponding communication is counted (normal diagnosis performance operation: S200).

If the value counted in the normal diagnosis performance operation (S200) exceeds a predetermined value (S300), it is finally determined that the state of the corresponding communication is the abnormality state, and informs the main BMS (abnormality state notification operation: S400). Herein, the predetermined value is a reference value for finally determining the abnormality state of the communication, and is set to 7 in one embodiment, but is not limited thereto. Also, if the count value of the normal diagnosis performance operation (S200) does not exceed the predetermined value (S300), the normal diagnosis performance operation (S200) is repeated.

The communication diagnosis preparation operation (S100) will be described in detail below with reference to FIG. 1 and FIG. 3.

Referring to FIG. 1, when one BMS is defined as BMS1 and another BMS is defined as BMS2, BMS3, BMS4, etc., the state of each communication periodically communicating with BMS2, BMS3, and BMS4 based on BMS1 is diagnosed.

Therefore, the diagnosis variable is allocated so as to have a bit size equal to or greater than the number of messages received in each BMS, and each bit of the allocated diagnosis variable is allocated as a diagnosis flag indicating whether the messages received in the BMS are normally received.

Figure 3:
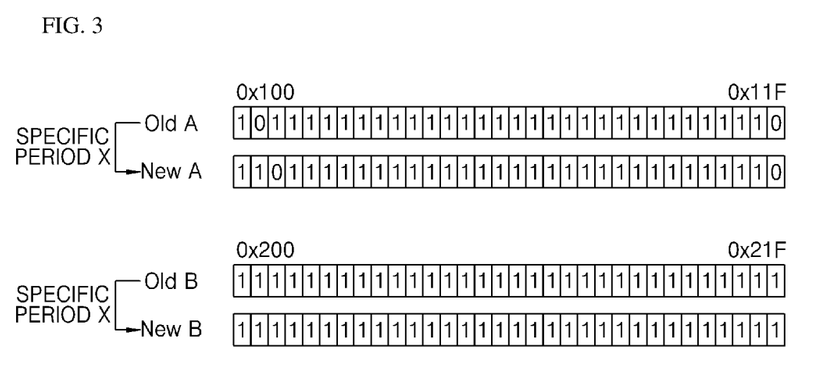
FIG. 3 is a view of an old diagnosis variable and a new diagnosis variable in a battery communication diagnosis method according to an exemplary embodiment.

FIG. 3 is a view of an old diagnosis variable and a new diagnosis variable in a battery communication diagnosis method according to an exemplary embodiment.

Referring to FIG. 3, when 32 messages are periodically received from BMS2 by BMS1, 32 is assigned to a diagnosis variable A for diagnosis of communication with BMS2. An old diagnosis variable A for recording whether or not the messages of the previous diagnosis period are normally received and a new diagnosis variable A for recording whether or not the messages of the current diagnosis period are normally received are included.

In addition, each bit of the 32 old diagnosis variables A and the new diagnosis variables A is assigned to the diagnosis flag and the numbers 1 to 32 are set to the IDs of respective diagnosis flags so that each message may be identified.

The diagnosis variable, the temporary storage, and the message buffer are allocated to a memory inside or outside each battery module.

Hereinafter, the normal diagnosis performance operation (S200) will be described in more detail with reference to FIG. 4.

Figure 4:
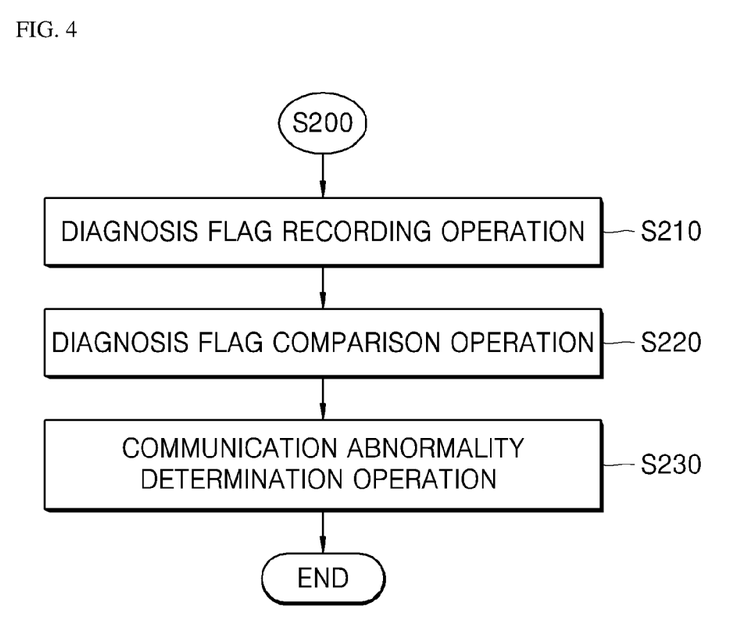
FIG. 4 is a flowchart showing a normal diagnosis performance operation in a battery communication diagnosis method according to an exemplary embodiment.

FIG. 4 is a flowchart of the normal diagnosis performance operation (S200) in a battery communication diagnosis method according to an exemplary embodiment.

Referring to FIG. 4, the normal diagnosis performance operation (S200) records whether the messages in the previous diagnosis period are normally received and whether the messages in the current diagnosis period are normally received as binary numbers in the respective diagnosis variables allocated in the communication diagnosis preparation operation (S100) (diagnosis variable recoding operation: S210), and if the old diagnosis variable and the new diagnosis variable recorded in the diagnosis variable recording operation (S210) are compared (diagnosis variable comparison operation S220) and it is confirmed that continuous abnormality reception values are recorded in the diagnosis flag at the same position, determines that the state of the corresponding communication is an abnormality state and counts (communication abnormality determination operation S230).

Herein, the recording in the diagnosis variable recording operation (S210) checks the message buffer and records '0' when the message is not received, and '1' when the message is received.

Furthermore, the reason for comparing the old diagnosis variable and the new diagnosis variable in the diagnosis variable comparison operation (S220) is that each BMS may have a delay or temporary bad reception when receiving messages, and in order to increase the accuracy of the communication state diagnosis, it is determined by comparing the diagnosis variable of the previous diagnosis period and the diagnosis variable of the current diagnosis period rather than determining the communication state by one diagnosis variable.

When the communication anomaly determination operation (S230) is completed, the stored value of the temporary storage is deleted, the message stored in the current message buffer is stored, and the message buffer is reset. Herein, the reason why the currently received message is stored is to correctly perform the normal diagnosis performance operation (S200) of the next period as the reception delayed message is normally received in that period and is marked as normally received in the next period.

In addition, the diagnosis variable recording operation (S210) will be described in more detail below with reference to FIG. 5.

Figure 5:
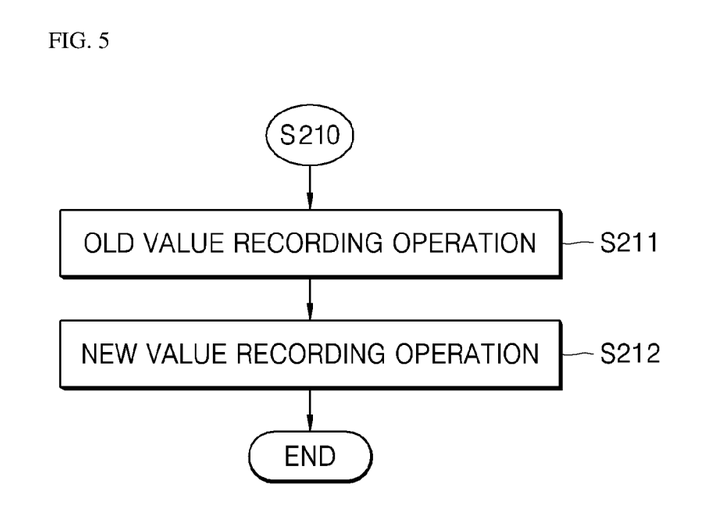
FIG. 5 is a flowchart showing a diagnosis variable recording operation in a battery communication diagnosis method according to an exemplary embodiment.

FIG. 5 is a flowchart of the diagnosis variable recording operation (S200) in a battery communication diagnosis method according to an exemplary embodiment.

Referring to FIG. 5, the diagnosis variable recording operation (S210) checks the temporary storage to record whether or not the messages of the previous diagnosis period are received in the old diagnosis variable (old recording operation: S211). In the first diagnosis of a diagnosis period, since there should be no previous diagnosis period and a message should be basically received, all the diagnosis flags of the old diagnosis variable recording whether or not the messages received at the BMS are normally received are recorded as '1', that is, the normal reception state. The diagnosis flag performing diagnose is allocated based on the number of messages received periodically.

In addition, the message buffer is checked to record whether or not the messages in the current diagnosis period are normally received in the new diagnosis variable (new value recording operation: S212). Herein, the recording of the diagnosis flag may instantaneously diagnoses the abnormality state of the communication and compare two diagnosis flags to inform the main BMS but is not limited thereto.

Also, a method in which the old diagnosis variable and the new diagnosis variable recorded in the diagnosis variable recording operation (S210) are compared using a bit operator may be described with reference to FIG. 3.

Referring to FIG. 3, when the diagnosis flag is '1', the corresponding communication message is received. When the diagnosis flag is '0', the corresponding communication message is not received. In the diagnosis variable comparison operation (S220), the respective diagnosis flags of the old diagnosis variable and the new diagnosis variable are compared as follows.

(1) If the nth diagnosis flag of the old diagnosis variable and the nth diagnosis flag of the new diagnosis variable are both '0' and '0', the reception state of the corresponding message is abnormal so the nth message may indicate that there is an error in communication.

(2) If the nth diagnosis flag of the old diagnosis variable is '0' and the nth diagnosis flag of the new diagnosis variable is '1', the reception state of the corresponding message is abnormal so that the nth message may indicate that reception is delayed in communication or intermittent reception is poor.

(3) If the nth diagnosis flag of the old diagnosis variable is '1' and the nth diagnosis flag of the new diagnosis variable is '0', the reception state of the corresponding message is abnormal so that the nth message may indicate that reception is delayed in communication or intermittent reception is poor.

(4) If the nth diagnosis flag of the old diagnosis variable and the nth diagnosis flag of the new diagnosis variable are both '1' and '1', the reception state of the corresponding message is normal so the nth message may indicate that the message is normally received.

That is, in the cases (2) and (3), it may be said that reception delay occurs in the communication of the corresponding message or intermittently reception is poor. Only in the case of (1) above, since a communication error of the corresponding message occurs, the number of times of communication abnormality state is counted.

Also, since the diagnosis variable comparison operation (S220) performs comparison through the OR operator among the bit operators, when comparing the diagnosis flag of one message, if either the diagnosis flag of the old diagnosis variable and the diagnosis flag of the new diagnosis variable is '1', the result of comparison is indicated as '1', so that it is determined that the corresponding communication is not an abnormality state.

Therefore, if there is one '1' in the old diagnosis variable A or the new diagnosis variable A, as shown in the 0x101 diagnosis flag and the 0x102 diagnosis flag of the diagnosis variable A, the comparison result value of the OR operator is indicated as '1', and since this is no more than the reception is delayed or the reception is intermittently poor, it is not regarded that the message of the corresponding diagnosis flag is an abnormality state.

On the other hand, if the diagnosis flag of old diagnosis variable A and the diagnosis flag of the new diagnosis variable A have the same value '0' as in the 0x11F diagnosis flag, the comparison result value of the OR operator is indicated as '0' and the corresponding message is not continuously received. Therefore, it is determined that there is an abnormality in the communication itself, and the number of times of abnormality state determination of the corresponding communication is counted.

On the other hand, since the diagnosis flag of the diagnosis variable B does not have '0' in both the old diagnosis variable B and the new diagnosis variable B, the comparison result value of the OR operator is marked as '1' so that it is regarded that all messages are normally received.

In another embodiment, unlike the method of newly recording the old diagnosis variable and the new diagnosis variable of the diagnosis flag recording operation (S210) for each diagnosis period, the method of replacing the new diagnosis variable recorded in the current diagnosis period with the old diagnosis variable in the next period to record only a new diagnosis variable for each diagnosis period that performs the diagnosis may be used. Such a method may reduce the size of the used capacity of the memory allocated like the temporary storage and prevent congestion caused by storing the entire message.

First, a communication state diagnosis period is set for each individual BMS, and a diagnosis variable and a message buffer are allocated to prepare for diagnosis of a communication state of each BMS (communication diagnosis preparation operation).

Herein, the communication state diagnosis period is set according to a message transmission period of each BMS that transmits a message to one BMS, and the diagnosis variable includes a diagnosis variable of a previous diagnosis period replaced with an old diagnosis variable, and a new diagnosis variable for recording whether or not the messages of the current diagnosis period are normally received.

In addition, the messages of the corresponding communication, which are received at the BMS of the current diagnosis period may be stored in the message buffer, and by checking the message buffer, it may be confirmed whether or not the messages received periodically between the BMSs are normally received.

Moreover, if the communication state for each BMS is diagnosed with respect to the plurality of BMSs and the state of the communication is abnormal, the counting of the abnormality state occurrence in the corresponding communication is repeated for each period set in the communication diagnosis preparation operation (normal diagnosis performance operation).

If the value counted in the normal diagnosis performance operation exceeds a predetermined value, it is finally determined that the state of the corresponding communication is the abnormality state, and informs the main BMS (abnormality state notification operation). Herein, the predetermined value is a value for finally determining the abnormality state of the communication, and may be arbitrarily set by a user. Also, if the count value of the normal diagnosis performance operation does not exceed the predetermined value, the normal diagnosis performance operation is repeated.

The communication diagnosis preparation operation will be described in detail below with reference to FIG. 1 and FIG. 3.

Referring to FIG. 1, when one BMS is defined as BMS1 and another BMS is defined as BMS2, BMS3, BMS4, etc., the state of each communication periodically communicating with BMS2, BMS3, and BMS4 based on BMS1 is diagnosed.

Therefore, the diagnosis variable is allocated so as to have a bit size equal to or greater than the number of messages received in each BMS, and each bit of the allocated diagnosis variable is allocated as a diagnosis flag indicating whether or not the messages received in the BMS are normally received.

In addition, referring to FIG. 3, for one example, when 32 messages are periodically received from BMS2 by BMS1, 32 is assigned to a diagnosis variable A for diagnosis of communication with BMS2. Each bit of 32 diagnosis variables A is assigned to a diagnosis flag for recording whether or not the messages of the current diagnosis period are normally received. The numbers 1 to 32 of the diagnosis variable A are set to the IDs of respective diagnosis flag so that each message may be identified.

The diagnosis variable and the message buffer are allocated to a memory inside or outside each battery module.

Meanwhile, the normal diagnosis performance operation may replace the new diagnosis variable of the previous diagnosis period with the old diagnosis variable (old diagnosis variable replacement operation) and records whether or not the messages in the current diagnosis period are normally received in the new diagnosis variable allocated in the communication diagnosis preparation operation (new diagnosis variable recording operation).

The old diagnosis variable replaced in the old diagnosis variable replacement operation is compared with the new diagnosis variable recorded in the diagnosis variable recording operation (diagnosis variable comparison operation) and if it is confirmed that a continuous abnormal reception value is recorded in the diagnosis flag of the same position, it is determined that the state of the corresponding communication is an abnormality state and counted (communication abnormality determination operation).

Herein, the recording in the new diagnosis variable recording operation checks the message buffer and records '0' when the message is not received, and '1' when the message is received.

In addition, in the case of the first period, all diagnosis flags of the old diagnosis variable assigned in the communication diagnosis preparation operation are recorded as '1', which is the normal reception state of the message, and this enables the first normal diagnosis performance without the new diagnosis variable of the previous diagnosis period.

Furthermore, the reason for comparing the old diagnosis variable and the new diagnosis variable in the diagnosis variable comparison operation is that each BMS may have a delay or temporary bad reception when receiving messages, and in order to increase the accuracy of the communication state diagnosis, it is determined by comparing the diagnosis variable of the previous diagnosis period and the diagnosis variable of the current diagnosis period rather than determining the communication state by one diagnosis variable.

In addition, when the communication abnormality determination operation ends, the message buffer, which can store only messages received in the current diagnosis period, is reset.

Meanwhile, the old diagnosis variable replacement operation and the new diagnosis variable recording operation are included in the diagnosis variable recording operation, and such diagnosis variable recording operation will be described below using an example.

If the current diagnosis period is n-th, the old diagnosis variable replacement operation replaces the new diagnosis variable of the n−1 period with the old diagnosis variable of the nth period. Herein, since the diagnosis variables are allocated to the memory, the new diagnosis variable of the n−1 period is replaced with the old diagnosis variable of the n period without any additional storage.

Also, the recording operation of the new diagnosis variable records whether or not messages are normally received in the new diagnosis variable of the current nth period by checking the message buffer as in the above embodiment.

In addition, the diagnosis variable comparison operation will be described below in more detail.

Also, a method in which the old diagnosis variable and the new diagnosis variable recorded in the diagnosis variable recording operation are compared using a bit operator may be described with reference to FIG. 3.

Referring to FIG. 3, when the diagnosis flag is '1', the corresponding communication message is received. When the diagnosis flag is '0', the corresponding communication message is not received. In the diagnosis variable comparison operation (S220), the respective diagnosis flags of the old diagnosis variable and the new diagnosis variable are compared as follows.

(1) If the nth diagnosis flag of the old diagnosis variable and the nth diagnosis flag of the new diagnosis variable are both '0' and '0', the reception state of the corresponding message is abnormal so the nth message may indicate that there is an error in communication.

(2) If the nth diagnosis flag of the old diagnosis variable is '0' and the nth diagnosis flag of the new diagnosis variable is '1', the reception state of the corresponding message is abnormal so that the nth message may indicate that reception is delayed in communication or intermittent reception is poor.

(3) If the nth diagnosis flag of the old diagnosis variable is '1' and the nth diagnosis flag of the new diagnosis variable is '0', the reception state of the corresponding message is abnormal so that the nth message may indicate that reception is delayed in communication or intermittent reception is poor.

(4) If the nth diagnosis flag of the old diagnosis variable and the nth diagnosis flag of the new diagnosis variable are both '1' and '1', the reception state of the corresponding message is normal so the nth message may indicate that the message is normally received.

That is, in the cases (2) and (3), it may be said that reception delay occurs in the communication of the corresponding message or intermittently reception is poor. Only in the case of (1) above, since a communication error of the corresponding message occurs, the number of times of communication abnormality state is counted.

Also, since the diagnosis variable comparison operation performs comparison through the OR operator among the bit operators, when comparing the diagnosis flag of one message, if either the diagnosis flag of the old diagnosis variable and the diagnosis flag of the new diagnosis variable is '1', the result of comparison is indicated as '1', so that it is determined that the corresponding communication is not an abnormality state.

Therefore, if there is one '1' in the old diagnosis variable A or the new diagnosis variable A, as shown in the 0x101 diagnosis flag and the 0x102 diagnosis flag of the diagnosis variable A, the comparison result value of the OR operator is indicated as '1', and since this is no more than the reception is delayed or the reception is intermittently poor, it is not regarded that the message of the corresponding diagnosis flag is an abnormality state.

On the other hand, if the diagnosis flag of old diagnosis variable A and the diagnosis flag of the new diagnosis variable A have the same value '0' as in the 0x11F diagnosis flag, the comparison result value of the OR operator is indicated as '0' and the corresponding message is not continuously received. Therefore, it is determined that there is an abnormality in the communication itself, and the number of times of abnormality state determination of the corresponding communication is counted.

On the other hand, since the diagnosis flag of the diagnosis variable B does not have '0' in both the old diagnosis variable B and the new diagnosis variable B, the comparison result value of the OR operator is marked as '1' so that it is regarded that all messages are normally received.

2. Battery Communication Diagnosis Device According to Embodiment of Present Invention The battery communication diagnosis device of the present disclosure confirms whether or not a message transmitted/received between BMSs of a battery module is received, detects the state of corresponding communication, and informs the main BMS to use the battery stably when there is an error.

Figure 6:
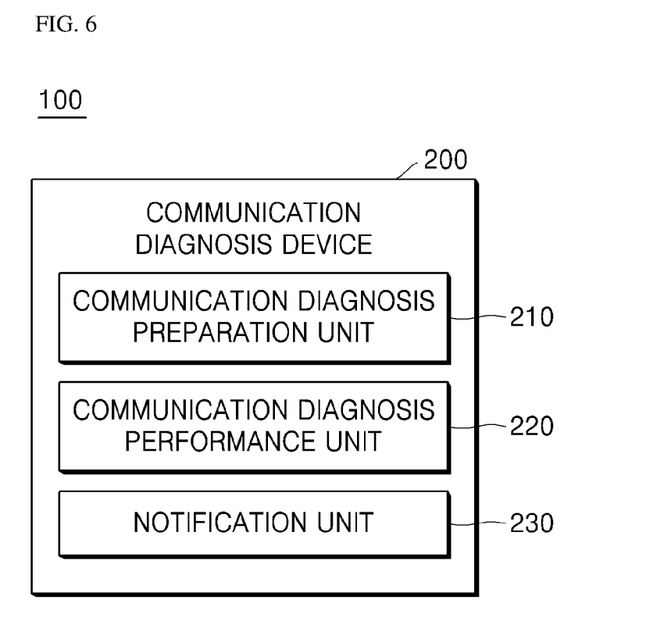
FIG. 6 is a block diagram of a communication diagnosis device in a BMS of a battery module according to an exemplary embodiment.

FIG. 6 is a block diagram of a communication diagnosis device in a BMS of a battery module according to an exemplary embodiment.

Referring to FIG. 6, the communication diagnosis device 200 in the BMS 100 of the battery module according to an exemplary embodiment includes a communication diagnosis preparation unit 210 for setting a communication diagnosis performance option to perform a communication diagnosis between the BMSs 100 of the battery module, a communication diagnosis performance unit 220 for repeatedly diagnosing whether or not communication is normal according to a communication diagnosis performance option set in the communication diagnosis preparation unit 210, and a notification unit 230 for transmitting a communication abnormality notification signal of the corresponding communication to the main BMS when the communication diagnosis performance unit 220 diagnoses that the corresponding communication is abnormal.

In addition, as shown in FIG. 1, the BMS1 100 of the battery module is connected including the main BMS and communicates with BMS2, BMS3, BMS4, and so on of the other battery modules using the CAN communication CAN.

Furthermore, the communication diagnosis device 200 will be described in detail with reference to FIG. 7.

Figure 7:
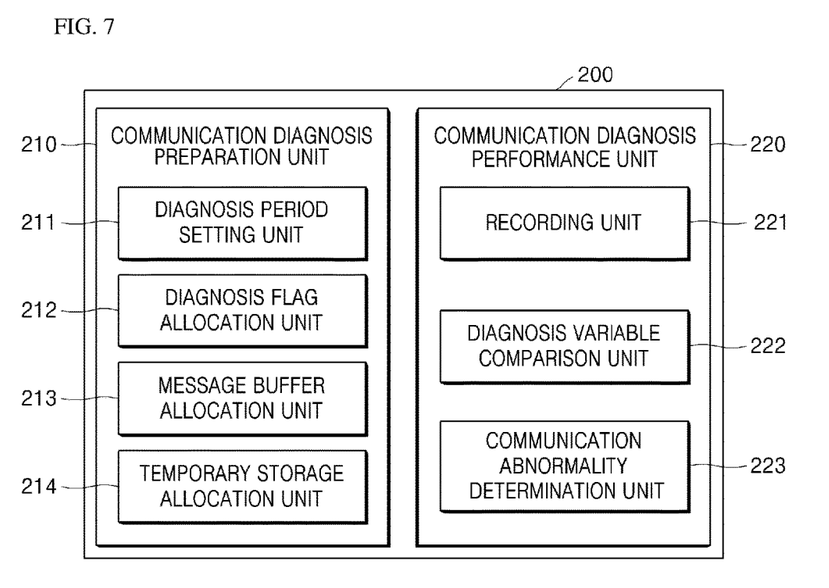
FIG. 7 is a detailed block diagram of a communication diagnosis device according to an exemplary embodiment.

FIG. 7 is a detailed block diagram of a communication diagnosis device according to an exemplary embodiment.

Referring to FIG. 7, the communication diagnosis preparation unit 210 in the communication diagnosis device 200 includes a diagnosis period setting unit 211 for setting a diagnosis period in which a communication diagnosis is performed based on a message transmission period of each BMS that transmits a message to the BMS 100 of one battery module, a diagnosis variable allocation unit 212 for allocating a diagnosis variable to record whether or not a message is normally received at the BMS 100 of the battery module, a message buffer allocation unit 213 for allocating a message buffer to store the corresponding communication messages received at the BMS 100 of the battery module in the current diagnosis period, and a temporary storage allocation unit 214 for allocating a temporary storage to store the messages of the corresponding communication received in the previous diagnosis period.

Herein, the diagnosis variable allocation unit 212 allocates a diagnosis variable having a bit size equal to or greater than the number of messages received at each BMS, and allocates a diagnosis flag indicating whether or not each of the messages of the previous diagnosis period and the current diagnosis period received at the BMS is normally received to each bit of the allocated diagnosis variable to record whether or not all messages are received. In addition, the diagnosis variable allocation unit 212 divides and allocates the old diagnosis variable for recording whether or not the messages of the previous diagnosis period are normally received and the new diagnosis variable for recording whether or not the messages of the current diagnosis period are normally received.

In addition, the communication diagnosis device 200 deletes the stored value of the temporary storage (not shown) when the performance of one period is terminated in the communication diagnosis performance unit 220 and stores the message stored in the current message buffer (not shown). Upon completion of storing messages in the temporary storage (not shown), the message buffer (not shown) is reset.

In addition, the diagnosis variable, the message buffer, and the temporary storage are allocated to a memory inside or outside each battery module.

Also, the communication diagnosis performance unit 220 in the communication diagnosis device 200 includes a recording unit for recording the normal reception states of the messages in the previous diagnosis period in the old diagnosis variable allocated by the diagnosis variable allocation unit 212 and recording the normal reception states of the messages in the current diagnosis period in the new diagnosis variable allocated by the diagnosis variable allocation unit 212, a diagnosis variable comparison unit 222 for comparing each diagnosis flag including the old diagnosis variable and the new diagnosis variable recorded in the recording unit, and a communication abnormality determination unit 240 for determining that there is an abnormality in the corresponding communication based on the comparison result of the diagnosis variable comparison unit 222. Herein, the diagnosis variable comparison unit 222 compares the diagnosis flag in the old diagnosis variable with the diagnosis flag in the new diagnosis variable using the OR operator in the comparison operator, and checks whether or not a message corresponding to each diagnosis flag is normally received.

The recording unit 221 and the communication abnormality determination unit 240 will be described below in more detail with reference to FIG. 8.

Figure 8:
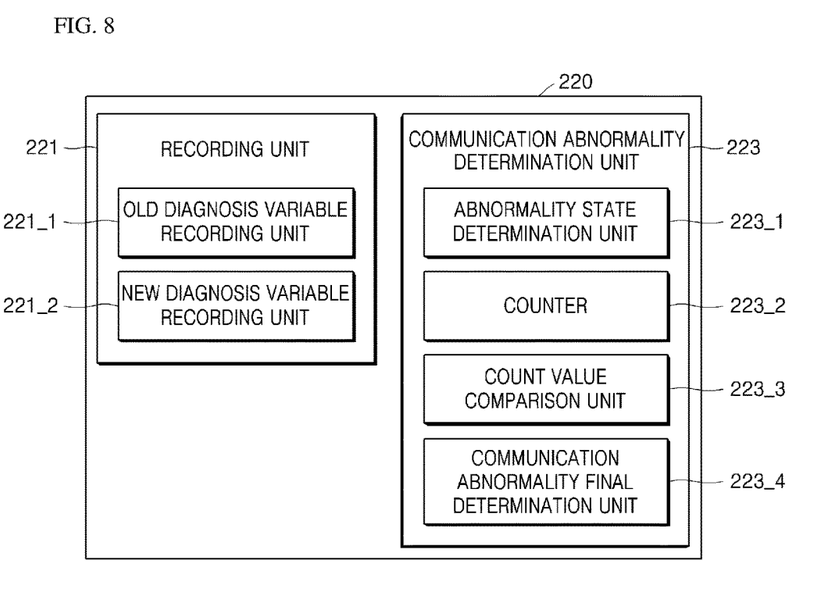
FIG. 8 is a detailed block diagram of a communication diagnosis performance unit in a communication diagnosis device according to an exemplary embodiment.

FIG. 8 is a detailed block diagram of a communication diagnosis performance unit in a communication diagnosis device according to an exemplary embodiment.

Referring to FIG. 8, the recording unit 221 in the communication diagnosis performance unit 220 includes an old diagnosis variable recording unit 221_1 for recording whether or not the messages of the previous diagnosis period are normally received in the old diagnosis variable by confirming the temporary storage (not shown) and a new diagnosis variable recording unit 221_2 for confirming the message buffer (not shown) and recording whether or not the messages of the current diagnosis period are normally received in the new diagnosis variable. Herein, in the case of the first diagnosis period in the old diagnosis variable recording unit 221_1, all the messages are recorded as a normal reception state in the diagnosis flag in the old diagnosis variable.

Also, the communication abnormality determination unit 223 in the communication diagnosis performance unit 220 includes an abnormality state determination unit 223_1 for determining a communication abnormality state according to the comparison result of the diagnosis variable comparison unit 222, a counter 223_2 for counting the number of times of abnormality state determination if it is determined that the state of communication is an abnormality state in the abnormality state determination unit 223_1, a count value comparison unit 223_3 for comparing whether or not the value counted in the counter 223_2 exceeds a predetermined value, and a communication abnormality final determination unit 223_4 for finally determining that the state of the corresponding communication is an abnormality state when the count value exceeds a predetermined value in the count value comparison unit 223_3. Here, the abnormality state determination unit 223_1 determines that the corresponding communication is in the normal state although the reception of the message is delayed or the reception is intermittently poor if there is a recording in which a message is not received in one of the diagnosis flag of the old diagnosis variable and the diagnosis flag of the new diagnosis variable, and takes a measure such as informing the main BMS that the corresponding communication is in the abnormality state if message are not received in both the diagnosis flag of the old diagnosis variable and the diagnosis flag of the new diagnosis variable.

Accordingly, the communication diagnosis device 200 sets a communication diagnosis period for performing diagnosis of communication for each individual BMS 100 through the diagnosis period setting unit 211 of the communication diagnosis preparation unit 210, and the diagnosis variable allocation unit 212 allocates an old diagnosis variable in which the normal reception of messages in the previous diagnosis period is recorded and a new diagnosis variable in which the reception of messages in the current diagnosis period is recorded, and allocates a diagnosis flag for recording whether or not the message is normally received in each bit of the old diagnosis variable and the new diagnosis variable. In addition, a message buffer (not shown) for storing a message received at a communication unit (not shown) in the BMS of the corresponding battery module in the current diagnosis period is allocated through the message buffer allocation unit 213, and a temporary storage (not shown) for storing a message received at a communication unit (not shown) in the BMS of the corresponding battery module in the previous diagnosis period is allocated through the temporary storage allocation unit 213, so that communication diagnosis performance is prepared.

Thereafter, the recording unit 220 in the communication diagnosis performance unit 220 records whether or not messages in the previous diagnosis period are normally received and whether or not messages in the current diagnosis period are normally received in binary numbers.

In more detail, the old diagnosis variable recording unit 221_1 in the recording unit 220 checks the received message of the previous diagnosis period stored in the temporary storage (not shown) to record whether or not messages are normally received as a binary number in the diagnosis flag in the old diagnosis variable, and the new diagnosis variable recording unit 221_2 checks the received message of the current diagnosis period stored in the message buffer (not shown) to record whether or not messages are normally received as a binary number in each diagnosis flag in the new diagnosis variable.

Further, each diagnosis flag in the old diagnosis variable recorded in the old diagnosis variable recording unit 221_1 and the new diagnosis variable recorded in the new diagnosis variable recording unit 221_2 is compared through the diagnosis variable comparison unit 222, and if at least one abnormal reception value is recorded in the diagnosis flag at the same position, the abnormality state determination unit 223_1 in the communication abnormality determination unit 223 determines that the corresponding communication is in an abnormality state and the counter 242 counts the number of abnormality state determinations.

The count value comparison unit 243 checked that the number of abnormality state determinations exceeds a predetermined value, and if the number of abnormality state determinations exceeds the predetermined value, the communication abnormality final determination unit 244 finally determines that there is an error in the corresponding communication and informs the main BMS (not shown) by using the notification unit 230. If the number of abnormality state determinations does not exceed the predetermined value, the communication diagnosis performance unit 220 performs a communication diagnosis again.

In another embodiment, as the new diagnosis variable used in the previous diagnosis period is replaced with the old diagnosis variable of the current diagnosis period by using an old diagnosis variable replacement unit instead of the old diagnosis variable recording unit 221_1 in the recording unit 221, since only the new diagnosis variable is newly recorded through the new diagnosis variable recording unit 221_2 for each diagnosis period in which the diagnosis is performed, the temporary storage is not allocated. Therefore, the size of the used capacity of the memory may be reduced and congestion caused by storing the entire message of the previous diagnosis period in the temporary storage may be prevented.

The communication diagnosis device 200 in the BMS 100 of the battery module according to another embodiment of the present disclosure includes a communication diagnosis preparation unit 210 for setting a communication diagnosis performance option to perform a communication diagnosis between the BMSs 100 of the battery module, a communication diagnosis performance unit 220 for repeatedly diagnosing whether or not communication is normal according to a communication diagnosis performance option set in the communication diagnosis preparation unit 210, and a notification unit 230 for transmitting a communication abnormality notification signal of the corresponding communication to the main BMS when the communication diagnosis performance unit 220 diagnoses that the corresponding communication is abnormal.

In addition, as shown in FIG. 1, the BMS1 100 of the battery module is connected including the main BMS and communicates with BMS2, BMS3, BMS4, and so on of the other battery modules using the CAN communication CAN.

In addition, the communication diagnosis preparation unit 210 in the communication diagnosis device 200 includes a diagnosis period setting unit 211 for setting a diagnosis period in which a communication diagnosis is performed based on a message transmission period of each BMS that transmits a message to the BMS 100 of one battery module, a diagnosis variable allocation unit 212 for allocating a diagnosis variable to record whether or not a message is normally received at the BMS 100 of the battery module, and a message buffer allocation unit 213 for allocating a message buffer to store the corresponding communication messages received at the BMS 100 of the battery module in the current diagnosis period.

Herein, the diagnosis variable allocation unit 212 allocates a diagnosis variable having a bit size equal to or greater than the number of messages received at each BMS, and allocates a diagnosis flag indicating whether or not each of the messages of the previous diagnosis period and the current diagnosis period received at the BMS is normally received to each bit of the allocated diagnosis variable to record whether or not all messages are received. In addition, the diagnosis variable allocation unit 212 divides and allocates the old diagnosis variable in which the diagnosis variable for recording whether or not the messages of the previous diagnosis period are normally received is replaced and the new diagnosis variable for recording whether or not the messages of the current diagnosis period are normally received.

In addition, the communication diagnosis device 200 resets the message buffer (not shown) when the performance of one period is terminated in the communication diagnosis performance unit 220.

In addition, the diagnosis variable and the message buffer are allocated to a memory inside or outside each battery module. Therefore, since the old diagnosis variable is already stored in the memory, no separate temporary storage or storage is required.

Also, the communication diagnosis performance unit 220 in the communication diagnosis device 200 includes a recording unit for replacing the new diagnosis variable recorded in the previous diagnosis period with the old diagnosis variable allocated by the diagnosis variable allocation unit 212, and recording the normal reception states of the messages in the current diagnosis period in the new diagnosis variable allocated by the diagnosis variable allocation unit 212, a diagnosis variable comparison unit 222 for comparing each diagnosis flag including the old diagnosis variable and the new diagnosis variable recorded in the recording unit, and a communication abnormality determination unit 240 for determining that there is an abnormality in the corresponding communication based on the comparison result of the diagnosis variable comparison unit 222. Herein, the diagnosis variable comparison unit 222 compares the diagnosis flag in the old diagnosis variable with the diagnosis flag in the new diagnosis variable using the OR operator in the comparison operator, and checks whether or not a message corresponding to each diagnosis flag is normally received.

Furthermore, the recording unit 221 and the communication abnormality determination unit 240 will be described below in more detail.

The recording unit 221 in the communication diagnosis performance unit 220 includes an old diagnosis variable recording unit for replacing the new diagnosis variable of the previous diagnosis period with the old diagnosis variable of the current diagnosis period and a new diagnosis variable recording unit for confirming the message buffer (not shown) and recording whether or not the messages of the current diagnosis period are normally received in the new diagnosis variable. Herein, in the case of the first diagnosis period in the old diagnosis variable recording unit, all the messages are recorded as a normal reception state in the diagnosis flag in the old diagnosis variable and set.

Also, the communication abnormality determination unit 223 in the communication diagnosis performance unit 220 includes an abnormality state determination unit 223_1 for determining a communication abnormality state according to the comparison result of the diagnosis variable comparison unit 222, a counter 223_2 for counting the number of times of abnormality state determination if it is determined that the state of communication is an abnormality state in the abnormality state determination unit 223_1, a count value comparison unit 223_3 for comparing whether or not the value counted in the counter 223_2 exceeds a predetermined value, and a communication abnormality final determination unit 223_4 for finally determining that the state of the corresponding communication is an abnormality state when the count value exceeds a predetermined value in the count value comparison unit 223_3. Here, the abnormality state determination unit 223_1 determines that the corresponding communication is in the normal state although the reception of the message is delayed or the reception is intermittently poor if there is a recording in which a message is not received in one of the diagnosis flag of the old diagnosis variable and the diagnosis flag of the new diagnosis variable, and takes a measure such as informing the main BMS that the corresponding communication is in the abnormality state if message are not received in both the diagnosis flag of the old diagnosis variable and the diagnosis flag of the new diagnosis variable.

Accordingly, the communication diagnosis device 200 sets a communication diagnosis period for performing diagnosis of communication for each individual BMS 100 through the diagnosis period setting unit 211 of the communication diagnosis preparation unit 210, and the diagnosis variable allocation unit 212 allocates an old diagnosis variable in which the diagnosis variable for recording whether or not the messages of the previous diagnosis period are normally received is replaced and a new diagnosis variable for recording whether or not the message is normally received in each bit of the old diagnosis variable and the new diagnosis variable. Further, as a message buffer (not shown) for storing a message received at the BMS of the communication unit (not shown) of the corresponding battery module in the current diagnosis period is allocated through the message buffer allocation unit 213 to prepare a communication diagnosis performance.

Then, the recording unit 220 in the communication diagnosis performance unit 220 replaces the new diagnosis variable in the previous diagnosis period with the old diagnosis variable, and records whether or not the messages are normally received in the current diagnosis period in the new diagnosis variable.

More specifically, the old diagnosis variable replacement unit (not shown) in the recording unit 220 checks the message buffer (not shown) in the previous diagnosis period to replace a new diagnosis variable for recording whether or not messages are normally received, and the new diagnosis variable recording unit 221_2 checks the messages received in the current diagnosis period stored in the message buffer (not shown) to record whether or not the messages are normally received as a binary number in each diagnosis flag in the new diagnosis variable.

Further, each diagnosis flag in the old diagnosis variable replaced in the old diagnosis variable recording unit and the new diagnosis variable recorded in the new diagnosis variable recording unit 221_2 is compared through the diagnosis variable comparison unit 222, and if at least one abnormal reception value is recorded in the diagnosis flag at the same position, the abnormality state determination unit 223_1 in the communication abnormality determination unit 223 determines that the corresponding communication is in an abnormality state and the counter 242 counts the number of abnormality state determinations.

The count value comparison unit 243 checked that the number of abnormality state determinations exceeds a predetermined value, and if the number of abnormality state determinations exceeds the predetermined value, the communication abnormality final determination unit 244 finally determines that there is an error in the corresponding communication and informs the main BMS (not shown) by using the notification unit 230. If the number of abnormality state determinations does not exceed the predetermined value, the communication diagnosis performance unit 220 performs a communication diagnosis again.

The battery communication diagnosis method according to an exemplary embodiment may check whether or not messages are normally received for each diagnosis period of each BMS and compare the recording for each period to check the abnormality state of the corresponding communication, so that it may use a battery stably.

Although the battery communication diagnosis method has been described with reference to the specific embodiments, it is not limited thereto. Therefore, it will be readily understood by those skilled in the art that various modifications and changes can be made thereto without departing from the spirit and scope of the present disclosure defined by the appended claims.

What is claimed is:

1. A battery communication diagnosis method between a plurality of battery management systems (BMSs), the method comprising:
    a communication diagnosis preparation operation for setting a communication diagnosis period for each BMS and allocating a diagnosis variable, a message buffer, and a temporary storage;
    a normal diagnosis performance operation for counting an abnormality state occurrence if a communication state is abnormal by diagnosing the communication state for each BMS with respect to the plurality of BMSs; and
    an abnormality state notification operation for finally determining a state of a corresponding communication is an abnormality state to inform a main BMS if a value counted in the normal diagnosis performance operation exceeds a predetermined value,
    wherein if the value counted by the normal diagnosis performance operation does not exceed the predetermined value, the normal diagnosis performance operation is repeated according to the set communication diagnosis period.

2. The method of claim 1, wherein the diagnosis variable is allocated to have a bit size equal to or greater than the number of messages received at each BMS to record whether or not each of the messages is normally received and comprises an old diagnosis variable for recording whether or not messages of a previous diagnosis period are normally received and a new diagnosis variable for recording whether or not messages of a current diagnosis period are normally received, and each bit of the old diagnosis variable and the new diagnosis variable is allocated as a diagnosis flag indicating whether or not each of the messages of the previous diagnosis period and the current diagnosis period received at the BMS is normally received.

3. The method of claim 1, wherein the normal diagnosis performance operation comprises a diagnosis variable recording operation including an old diagnosis variable recording operation for recording whether or not messages in a previous diagnosis period are normally received as an old diagnosis variable for each diagnosis variable allocated in the communication diagnosis preparation operation, and a new diagnosis variable recording operation for recording whether messages in a current diagnosis period are normally received as a new diagnosis variable;
    a diagnosis variable comparison operation for comparing each diagnosis flag including the old diagnosis variable and the new diagnosis variable recorded in the diagnosis variable recording operation; and
    a communication abnormality determination operation for determining that a state of a corresponding communication is an abnormality state and counting the state if it is determined in the diagnosis variable comparison operation that a continuous abnormality reception value is recorded in a diagnosis flag of the same position.

4. The method of claim 3, wherein during a first diagnosis period in the diagnosis variable recording operation, all old diagnosis variables are recorded as a normal reception state.

5. The method of claim 3, wherein the diagnosis variable comparison operation compares each diagnosis flag of a new diagnosis variable and an old diagnosis variable recorded in the diagnosis variable recording operation by using a bit operator.

6. The method of claim 1, wherein the normal diagnosis performance operation comprises:
a diagnosis variable recording operation including a current diagnosis variable recording operation for recording whether or not messages in a current diagnosis period are normally received in each diagnosis variable allocated in the communication diagnosis preparation operation, and an old diagnosis variable replacement operation for replacing a diagnosis variable of a previous diagnosis period recorded during the previous diagnosis period with an old diagnosis variable;
a diagnosis variable comparison operation for comparing each diagnosis flag including a new diagnosis variable and the old diagnosis variable recorded in the diagnosis variable recording operation; and
a communication abnormality determination operation for determining that a state of a corresponding communication is an abnormality state and counting the state if it is determined in the diagnosis variable comparison operation that a continuous abnormality reception value is recorded in a diagnosis flag of the same position.

7. The method of claim 1, wherein the communication diagnosis period of the communication diagnosis preparation operation is set according to a message transmission period of each BMS transmitting a message.

8. The method of claim 1, wherein a message buffer of the communication diagnosis preparation operation stores messages of a corresponding communication received at a BMS of a current diagnosis period.

9. The method of claim 1, wherein a temporary storage of the communication diagnosis preparation operation stores messages of a corresponding communication received at a BMS of a previous diagnosis period.

10. A communication diagnosis device included in a BMS of each battery module and diagnosing communication between BMSs of at least one battery module, the device comprising a non-transitory processor having programmed thereon:
a communication diagnosis preparation unit configured to set a communication diagnosis performance option to perform a communication diagnosis between BMSs of the battery module;
a communication diagnosis performance unit configured to repeat diagnosing whether or not communication is abnormal according to the communication diagnosis performance option set in the communication diagnosis preparation unit; and
a notification unit configured to transmit a communication abnormality notification signal of a corresponding communication to a main BMS if the communication diagnosis performance unit diagnoses that the corresponding communication is abnormal.

11. The device of claim 10, wherein the communication diagnosis preparation unit comprises:
a diagnosis period setting unit configured to set a diagnosis period in which a communication diagnosis is performed based on a message transmission period of each BMS transmitting a message to a BMS of one battery module;
a diagnosis variable allocation unit configured to allocate a diagnosis variable to record whether or not messages received at a BMS of the battery module are normally received;
a message buffer allocation unit configured to allocate a message buffer to store messages of a corresponding communication received at a BMS of the battery module of a current diagnosis period; and
a temporary storage allocation unit configured to allocate a temporary storage to store messages of a corresponding communication received at a BMS of the battery module of a previous diagnosis period.

12. The device of claim 11, wherein the diagnosis variable allocation unit allocates an old diagnosis variable for recording whether or not messages of the previous diagnosis period are normally received and a new diagnosis variable for recording whether or not messages of the current diagnosis period are normally received, with a bit size equal to or greater than the number of messages received at each BMS to allocate a diagnosis flag indicating whether or not each of the messages of the previous diagnosis period and the current diagnosis period received at the BMS is normally received to each bit of the old diagnosis variable and the new diagnosis variable.

13. The device of claim 10, wherein the communication diagnosis performance unit comprises:
a recording unit including an old diagnosis variable recording unit for recording whether or not messages in a previous diagnosis period are normally received as an old diagnosis variable allocated by the communication diagnosis preparation unit and a new diagnosis variable recording unit for recording whether or not messages in a current diagnosis period are normally received as a new diagnosis variable;
a diagnosis variable comparison unit configured to compare each diagnosis flag including the old diagnosis variable and the new diagnosis variable recorded by the recording unit; and
a communication abnormality determination unit configured to determine that a corresponding communication is abnormal based on a comparison result of the diagnosis variable comparison unit.

14. The device of claim 13, wherein during a first diagnosis period in the diagnosis variable recording unit, all old diagnosis variables are recorded as a normal reception state.

15. The device of claim 13, wherein the diagnosis variable comparison unit compares values through a comparison operator.

16. The device of claim 13, wherein the communication abnormality determination unit comprises:
an abnormality state determination unit configured to determine an abnormality state of communication according to a comparison result of the diagnosis variable comparison unit;
a counter configured to count the number of abnormality state determinations if the abnormality state determination unit determines that a state of a corresponding communication is an abnormality state;
a count value comparison unit configured to compare whether or not a value counted by the counter exceeds a predetermined value; and
a communication abnormality final determination unit configured to finally determine that the state of the corresponding communication is the abnormality state if the value counted by the count value comparison exceeds the predetermined value.

17. The device of claim 10, wherein the communication diagnosis performance unit comprises:
- a recording unit including an old diagnosis variable replacement unit for replacing a diagnosis variable of a previous diagnosis period recorded allocated by the communication diagnosis preparation unit during the previous diagnosis period with an old diagnosis variable, and a new diagnosis variable recording unit for recording whether or not messages in a current diagnosis period are normally received as a new diagnosis variable of the current diagnosis period;
- a diagnosis variable comparison unit configured to compare each diagnosis flag including the old diagnosis variable and the new diagnosis variable of the current diagnosis period recorded in the recording unit; and
- a communication abnormality determination unit configured to determine that a corresponding communication is abnormal based on a comparison result of the diagnosis variable comparison unit.

* * * * *